Sept. 20, 1966 MINORU NAGATA 3,274,446

DARLINGTON CONFIGURATION TRANSISTOR CIRCUIT

Filed Jan. 3, 1963

United States Patent Office 3,274,446

Patented Sept. 20, 1966

3,274,446
DARLINGTON CONFIGURATION TRANSISTOR CIRCUIT

Minoru Nagata, Kodaira-shi, Japan, assignor to Kabushiki Kaisha Hitachi Seisakusho, Tokyo-to, Japan, a joint-stock company of Japan Filed Jan. 3, 1963, Ser. No. 249,275
Claims priority, application Japan, Jan. 8, 1962, 37/251, 37/252
5 Claims. (Cl. 317—33)

This invention relates to so-called Darlington configuration transistor circuits, and more particularly it relates to improvements in Darlington configuration circuits wherein, by combining a plurality of transistors, extremely high current amplification factors can be obtained.

The nature, principle, objects, and details of the invention will be best understood by reference to the following description when taken in conjunction with the accompanying drawing in which like parts are designated by the same reference letters, and in which.

Figure 1:
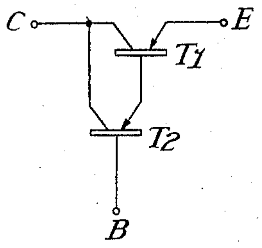
FIG. 1 is an electrical connection diagram indicating a typical Darlington configuration transistor circuit.

As indicated in FIG. 1, in a Darlington configuration transistor circuit, the base of a transistor $T_1$ is connected to the emitter of another transistor $T_2$, and the collectors of the two transistors are commonly connected, whereby a combination component which has a collector C, an emitter E, and a base B, and which may be considered to be a single transistor, is formed. The current amplification factor of this transistor is equal to the product of the current amplification factors of the transistors $T_1$ and $T_2$.

Such a Darlington configuration circuit is used in various transistor circuits, but when it is used, for example, as a series transistor of a series regulated transistor stabilized power supply, there is the possibility of flow of overcurrent due to such causes as short circuit of the load, whereby such failures as damage to the transistors occur. In order to prevent this flow of overcurrent, one possible measure is to cut off the input voltage. In this case, by using this Darlington configuration transistor circuit itself as a switch circuit, the necessity of providing a separate switch is eliminated, and an advantage in circuit composition is attained.

It is an object of the present invention to provide a circuit which is effective in the case wherein a Darlington circuit as described above is, itself, used as a switching means so as to prevent damage due to overcurrent to the Darlington configuration transistor.

Figure 2:
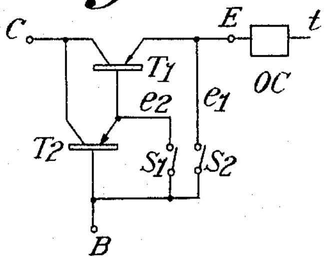
FIGS. 2 and 3 are electrical connection diagrams indicating transistor circuits of embodiments of the present invention.

Referring to FIG. 2, switches $S_1$ and $S_2$ are so connected as to short the emitters $e_1$ and $e_2$, respectively, of a Darlington configuration transistor to the base B and to be controlled simultaneously by an overcurrent relay OC. This relay OC may be inserted in the circuit of the collector C or that of the base B. When the current I flowing through the emitter E, collector C, or the base B of the Darlington configuration transistor circuit becomes excessive, this relay OC operates to close the switches $S_1$ and $S_2$, thereby shorting the emitters of the transistors to the base. When the emitter and the base are shorted, the impedance between the emitter and collector of a transistor becomes extremely high, and its breakdown voltage becomes several times that of conventional operation such as grounding the emitter. It will be apparent, therefore, that by the above-described shorting, the purpose of protection against overcurrent is attained.

In this case, from the fact that shorting the emitter E and the base B improves the breakdown voltage, by closing only the switch $S_2$ and maintaining the switch $S_1$ open, the impedance between the emitter E and collector C is caused to be high, and the purpose of protection can be attained to a certain degree. However, under this condition, since the base of the transistor $T_1$ is placed in an open condition, the breakdown voltage of the transistor $T_1$ does not increase to a very high value. For example, when a transistor of 2SB 83 type is used for $T_1$, and a transistor of 2SB 89 is used for $T_2$, the breakdown voltage between E and C is of the order of approximately 20 volts. However, in this case, when the switch $S_1$ is closed simultaneously with the switch $S_2$, since each transistor is placed in a state wherein its emitter is shorted to its base, the breakdown voltage between E and C increases to approximately 60 volts. Accordingly, when switching is to be carried out in a Darlington circuit to increase the breakdown voltage, it is most desirable that the shorting of the emitters of all transistors with their respective bases be accomplished simultaneously as indicated in FIG. 2. Such simultaneously shorting is desirable also in the case of three or more transistors connected in a Darlington configuration.

Figure 3:
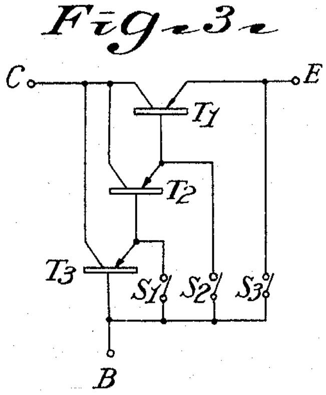

Such a circuit wherein three transistors are connected in a Darlington configuration is illustrated in FIG. 3. In this case, switches $S_1$, $S_2$, and $S_3$ for shorting of the same number as the three transistors are provided. It is to be observed that the insertion of a back bias voltage in series with these switches so that each transistor is cut off when the switches are closed is also effective for increase the breakdown voltage.

Figure 4:
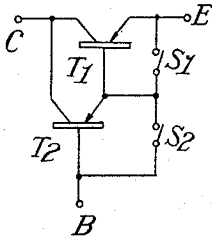
FIG. 4 is a diagram of a Darlington transistor circuit for comparative explanation of the function and effect according to this invention.

In view of the above fact that, in the above-described protection method, shorting between the emitter and collector of each transistor (or insertion of a back bias voltage) provides protection, it is possible to obtain protection in a similar manner also by inserting a switch $S_2$ between the emitter and base of the transistor $T_1$ and inserting a switch $S_1$ between the emitter and collector of the transistor $T_2$, as indicated in FIG. 4, provided that these switches $S_1$ and $S_2$ are closed simultaneously. In this case, however, if the switches $S_1$ and $S_2$ do not close simultaneously, and the closing of either one of these switches is delayed relative to that of the other, either the transistor $T_1$ or the transistor $T_2$ will not be in a protected state during a period equal to relative delay in switching. For example, if the switch $S_1$ in the circuit of FIG. 4 closes first, an overcurrent will flow through the transistor $T_2$, and, since the transistor $T_2$ is normally of smaller size than the transistor $T_1$, it will be easily damaged.

In contrast, when a switch is inserted between the common base B and each emitter as indicated in FIG. 2 or FIG. 3, full protection is provided almost completely irrespective of any relative delay in the operations of the switches. While the fullest protection is provided when the switches operate simultaneously, if the operations are in the sequence of $S_1$, $S_2$, $S_3$, . . ., the Darlington configuration will be, in effect cut off one stage at a time, wherefore the protective operation will not present a problem. The worst case is that when the switch operations are in the sequence of $S_3$, $S_2$, and $S_1$, but in this case also, a certain improvement in the breakdown voltage is attained, whereby protection is provided. Accordingly, if at least the switch $S_2$ in the circuit of FIG. 2 and the switch $S_3$ in the circuit of FIG. 3 are adapted to close first, a certain improvement in the breakdown voltage will thereby be attained, wherefore a slight delay in the closing of the other switches will not impose a problem. That is, more positive protection can be attained by the insertion of switches indicated in FIG. 2 (or FIG. 3) then by that indicated in FIG. 4.

It is to be understood that, in the embodiments described above, the switches may consist of not only mechanical switches, but also electronic switches, and that the means for detecting overcurrent need not be limited to an overcurrent relay. In addition, in the circuit of FIG. 2, it is necessary that the overcurrent relay OC self-held after operation, but in such a case, a circuit for this purpose is regulated. Furthermore, while the foregoing description has related to protective operation, it concerns, essentially, means for effectively placing a Darlington circuit in a cut-off state, and the same considerations may be applied to a high reverse breakdown voltage switching cir cuit.

It is another object of the present invention to provide a series regulated transistor stabilized power supply which, by the use of a Darlington transistor circuit as described above, is adapted to accomplish safe and positive protective operation, as described in detail hereinbelow.

Figure 5:
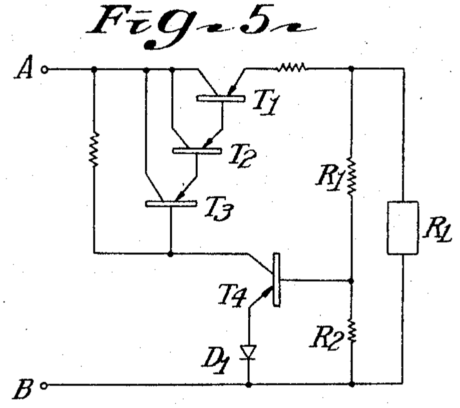
FIG. 5 is an electrical circuit diagram showing a typical series regulated transistor stabilized power supply of general type.

In general, a series regulated transistor stabilized power supply has a compositional arrangement as indicated in FIG. 5, which has a load $R_L$, input terminals A and B, and a Darlintgon circuit formed by three stages of transistors $T_1$, $T_2$, and $T_3$, and having emitter and collector terminals inserted in series between the load $R_L$ and the input terminal A. Resistances $R_1$ and $R_2$ divide the voltage applied to the load. A transistor $T_4$ which is used for error amplification compares a reference voltage created by a Zener diode $D_1$ and the divided voltage across the resistance $R_2$ and, when a difference occurs between these two voltages, amplifies this difference and imparts it to the base of the aforesaid Darlington transistor circuit. That is, when the load voltage fluctuates, the voltage across the resistance $R_2$ fluctuates. Consequently, the impedance across the collector of the transistor $T_4$ varies and controls the base input of the Darlington transistor so that the impedance between the emitter and collector of the Darlington circuit varies so as to correct the fluctuation of the load voltage.

In the case of a stabilized power supply of this type, when an overcurrent flows through the Darlington transistor ciircuit for control which is inserted in series with the load because of such a cause as shorting due to failure in the load, the transistors are damaged. Therefore, it is necessary to provide a protection circuit for detecting such overcurrent and preventing damage to the transistors. Heretofore, for this protection circuit, there have been proposed various circuits wherein, throught the use of semiconductor devices such as transistors or diodes, overvoltage overcurrent it detected, and purely electronic switching is accomplished to prevent damage to the transistors. However because of such reasons as high temperature dependency of the parameters of the said semiconductor devices, positive protective operation cannot be expected of any of these circuits.

One embodiment of a stabilized power supply according to the present invention in which such disadvantageous features as described above have been improved is shown in FIG. 6.

Figure 6:
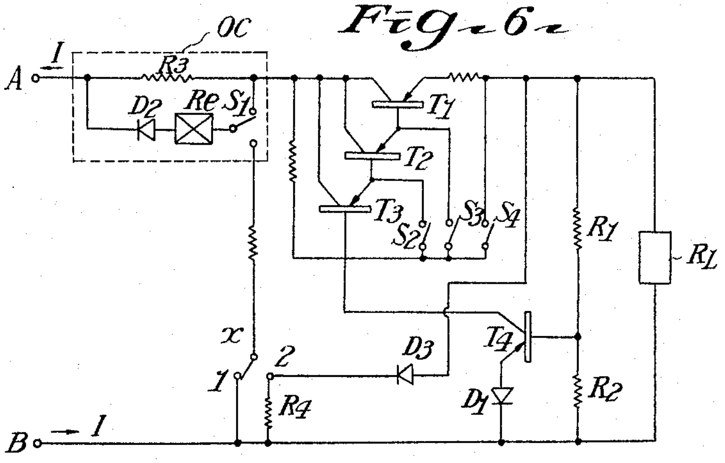
FIG. 6 is an electrical circuit diagram indicating one embodiment of the present invention.

Referring to FIG. 6, reference letters OC designate an overcurrent-detecting relay circuit, which is inserted in series in the path of the load current. This circuit OC is formed by a parallel connection of a resistance $R_3$ with a series connection of a diode $D_2$ having sharp forward characteristics (a silicon diode being convenient, but a Zener diode or a germanium diode being suitable in some cases) and a relay $R_e$. When a current I flowing through this circuit OC is below a certain value, it flows principally on the $R_3$ side, and when the current I becomes higher than a certain value, the greater part of this current is caused by the forward characteristics of the diode $D_2$ to flow through the relay $R_2$ to activate this relay. In this case, this relay is of multi-contact type, and when a current exceeding a predetermined value flows through and activates this relay, it causes the contacts $S_1$, $S_2$, $S_3$, and $S_4$ to contact, simultaneously, the side opposite the contact position indicated in FIG. 6. That is, when an overcurrent flows, the emitter terminals of all of the transistors forming the Darlington circuit and the base terminal of the transistor $T_3$ are shorted simultaneously. When the base and the emitter of a transistor are shorted, the impedance and the reverse breakdown voltage increase greatly. Consequently, the effect is equivalent to the insertion of a high impedance between the load $R_L$ and the input terminal A. As a net result, this operation becomes equivalent to that of the control transistor operating, itself, as a switch which cuts off the connection between the load and the input side. Since the breakdown voltage of the control transistor becomes extremely high compared with that under normal operating condition, damage is prevented. Even if only the switch $S_4$ is closed during this operation, the breakdown voltage between the collector and emitter of the transistor $T_1$ will increase, whereby a certain degree of damage prevention will be attained. In this case, however, since the base of the transistor is in an open state, the increase in the said breakdown voltage is only a fraction of the breakdown voltage increase in the case wherein the base is directly connected to the emitter by means of each switch. Therefore, more positive protection can be attained when all of the switches $S_2$, $S_3$, and $S_4$ are caused by the operation of the overcurrent-detecting relay to close simultaneously.

The reason for using the switch $S_1$ is that it is necessary, when the overcurrent relay OC has operated, for disconnecting this relay from the load current path and, at the same time, connecting it to the terminal B by way of a switch $x$, thereby causing a current of substantially the same magnitude as that at the time of overcurrent detection to flow and causing the switches $S_2$, $S_3$, and $S_4$ to be maintained in the contacting state at the instant of operation of the relay $R_e$, that is the state wherein all switches are closed, and the relay to be self-held. If this relay is incapable of self-holding (if $S_1$ does not exist), when the current caused by the closing of the switches $S_2$, $S_3$, and $S_4$ to flow through the relay OC decrease, the relay $R_e$ will return to the initial state and cause all of the switches $S_2$, $S_3$, and $S_4$ to open. When all of these switches are opened, the relay OC will operate again and close all of these switches again provided that the cause for generation of overcurrent is not removed. As a result, a repetition of the closing and opening of the switches $S_2$, $S_3$, and $S_4$ occurs, and it becomes impossible to obtain protective operation. Thus, it will be observed that the use of the switch $S_1$ as shown in FIG. 6 is important for preventing the above-described undesirable operation.

The afore-mentioned switch $x$ is a manually-operated switch for resetting and is used for the purpose of releasing the self-held state of the relay $R_e$. That is, when the relay OC is caused by the initial overcurrent to operate and enter its self-held state, it continues to be in this state even when the cause of overcurrent is removed (defect is remedied). Consequently, the Darlington circuit for control cannot operate, and it is not possible to accomplish stabilization operation. Accordingly, upon remedying the cause of overcurrent, the switch $x$ is manually switched over to contact 2 to release the relay OC from its self-held state, whereby the switch $S_1$ is caused to be switched over to its upper contact (as viewed in FIG. 6), and the switches $S_2$, $S_3$, and $S_4$ are opened and returned to their normal state.

Subsequent to the above-described, operation, the switch $x$ is again manually switched over to the side of the contact 1. If, however, when the switch is switched to the contact 2 side to release one relay OC from its self-held state, an overcurrent is still flowing, the relay OC operates promptly, wherefore it is necessary to cause the expected self-holding action at this time also. Therefore, it is necessary that the switch $x$ have, not only the function of releasing the self-held state, but also the function of causing self-holding if, when resetting is carried out, overcurrent is still flowing. For this purpose, a diode $D_3$ and a resistance $R_4$ are provided as shown in the circuit of FIG. 6.

More explicitly, when the switch $x$ is manually switched over from the contact 1 to the contact 2 side, if the load $R_L$ is still in a shorted state, the resulting shorted current flows through the diode $D_3$ and through $x$, $R_e$, and $D_2$, and $R_e$ continues to be in its self-held state. If, when the switch $x$ is switched over to the contact 2 side, the defect has been remedied, and the load $R_L$ is not in a shorted state, almost no current flows through $R_e$. Accordingly, effective resetting is then accomplished for the first time, and, upon confirmation of this fact, the switch $x$ is manually switched over to the contact 1 side in readiness for any further defect.

The various protection circuits in the apparatus of the present invention have no adverse effect whatsoever on stabilization operation. Accordingly, the design of the apparatus is greatly facilitated, and, moreover, positive and full protective operation can be accomplished therein. It will be appreciated, therefore, that the present invention is applicable to numerous practical applications.

It is to be observed, furthermore, that while the overcurrent relays OC in the above-described embodiment shown in FIG. 6 is inserted in the input side, the position of this relay need not be so limited, the essential requirement being that this relay OC be inserted in series in the path of the load current. Moreover, by using an overvoltage relay in place of the overcurrent relay OC, protection against overvoltage can be secured. In addition, it will be observed that the teachings of the present invention can be applied to current regulators.

Although this invention has been described with respect to particular embodiments thereof, it is not to be so limited as changes and modifications can be made therein which are within the full intended scope of the invention, as defined by the appended claims.

What is claimed is:

1. A Darlington configuration transistor circuit consisting of a combination of a plurality of transistors, which comprises:

a circuit construction having at least two transistors wherein the emitter of a second transistor is directly connected to the base of a first transistor and the collectors of said respective transistors are connected in common;

and switching means inserted between the base of said second transistor and the emittters of said respective transistors, whereby, when said switching means are simultaneously closed, the connection between the emitters of said respective transistors and the base of said second transistor in said circuit construction is shorted to cut-off said Darlington transistor circuit.

2. A Darlington configuration transistor circuit consisting of a combination of a plurality of transistors, which comprises:

a circuit construction having at least two transistors wherein the emittter of a second transistor is directly connected to the base of a first transistor and the collectors of the respective transistors are connected in common;

and switching means inserted between the base of said second transistor and the emitter of said respective transistors, whereby, when said switching means are simultaneously closed, a reverse bias voltage is impressed between the emitters of respective transistors and the base of the second transistor to place the Darlington transistor circuit in a cut-off state.

3. A transistor stabilized power supply means of the type having control transistor circuit of Darlington configuration according to claim 1 which is inserted in series with the load, and the impedance of which is controlled in response to variation of the said load, which comprises a relay for detecting overload state, a plurality of switches for creating shorts simultaneously between all emitters and their respective bases of the said Darlington transistor circuit for control when the said relay operates, and means for supplying to the said relay, at the time of operation of the said relay, a current which is separate from the load current to cause the said relay to be self held.

4. A series regulated transistor stabilized power supply apparatus of the type having a control transistor circuit of Darlington configuration which is inserted in series with the load of the said apparatus, and the impedance of which is controlled in response to variation of the said load, comprising the transistor circuit defined by claim 1, a relay for detecting overload state, a plurality of switches for creating shorts simultaneously between all emitters and their respective bases of the said Darlington transistor circuit control when the said relay operates, and means for supplying to the said relay, at the time of operation of the said relay, a current which is separate from the load current to cause the said relay to be self held.

5. A series regulated transistor stabilized power supply apparatus according to claim 3, wherein is provided a manually-operated switch for releasing the said relay for detecting overload state from its self-held state and a circuit for causing, through a separate circuit, the said relay to be self held when, at the time the said relay is so released from its self-held state, there is still an overload current flow.

References Cited by the Examiner

UNITED STATES PATENTS 3,178,617 4/1965 Coker ______________ 317—33

MAX L. LEVY, *Primary Examiner.*

SAMUEL BERNSTEIN, *Examiner.*

J. D. TRAMMELL, *Assistant Examiner.*